(12) United States Patent
Tatsumura

(10) Patent No.: US 10,496,569 B2
(45) Date of Patent: Dec. 3, 2019

(54) SEMICONDUCTOR INTEGRATED CIRCUIT

(71) Applicant: KABUSHIKI KAISHA TOSHIBA, Minato-ku (JP)

(72) Inventor: Kosuke Tatsumura, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/912,594

(22) Filed: Mar. 6, 2018

(65) Prior Publication Data

US 2019/0087365 A1 Mar. 21, 2019

(30) Foreign Application Priority Data

Sep. 19, 2017 (JP) .................................. 2017-179448

(51) Int. Cl.
*G11C 7/10* (2006.01)
*G06F 13/16* (2006.01)
(Continued)

(52) U.S. Cl.
CPC ...... *G06F 13/1684* (2013.01); *G06F 13/1689* (2013.01); *G06F 13/4022* (2013.01);
(Continued)

(58) Field of Classification Search
CPC ............. G06F 13/1684; G06F 13/4022; G11C 7/1045; G11C 11/419; G11C 7/1048; G11C 8/16; G11C 8/12; G11C 11/416; G11C 2207/005; G11C 7/1075; H03K 19/177
See application file for complete search history.

(56) References Cited

U.S. PATENT DOCUMENTS 5,717,651 A * 2/1998 Kikukawa ............... G11C 29/84
365/189.07
6,525,565 B2 * 2/2003 Young ..................... H04J 3/047
326/37

(Continued)

FOREIGN PATENT DOCUMENTS

JP 2005-346715 12/2005
JP 2014-199679 10/2014

OTHER PUBLICATIONS

Kosuke Tatsumura, et al. "High Density, Low Energy, Magnetic Tunnel Junction Based Block RAMs for Memory-rich FPGAs", IEEE International Conference on Field-Programmable Technology(FPT), 2016, 8 pages.

*Primary Examiner* — Vibol Tan
(74) *Attorney, Agent, or Firm* — Oblon, McClelland, Maier & Neustadt, L.L.P.

(57) ABSTRACT

A semiconductor integrated circuit according to an embodiment includes: a first memory bank that performing a read operation and outputting first data in accordance with a first clock signal; a second memory bank performing a read operation and outputting second data in accordance with the first clock signal; a configurable decoder supplying address information to the first and second memory banks; and an output module reconfigurable in one of a first and second modes, the first mode including a function of holding the first and second data in accordance with the first clock signal, and selecting and outputting the first data or the second data in accordance with a second clock signal having a frequency at least twice higher than the first clock signal, the second mode including a function of selecting and outputting the first data or the second data in accordance with the first clock signal.

10 Claims, 10 Drawing Sheets

(51) Int. Cl.
  *G06F 13/40* (2006.01)
  *G11C 8/12* (2006.01)
  *G11C 8/16* (2006.01)
  *G11C 11/416* (2006.01)
  *G11C 11/419* (2006.01)
  *H03K 19/177* (2006.01)

(52) U.S. Cl.
  CPC .......... *G11C 7/1045* (2013.01); *G11C 7/1048* (2013.01); *G11C 8/12* (2013.01); *G11C 8/16* (2013.01); *G11C 11/416* (2013.01); *G11C 11/419* (2013.01); *H03K 19/177* (2013.01); *G11C 7/1075* (2013.01); *G11C 2207/005* (2013.01)

(56) References Cited

U.S. PATENT DOCUMENTS

| | | | |
|---|---|---|---|
| 7,248,491 B1 * | 7/2007 | Ching | G11C 7/1075 365/230.05 |
| 7,317,644 B1 * | 1/2008 | Lin | G11C 7/1051 365/189.02 |
| 7,797,610 B1 | 9/2010 | Simkins | |
| 7,940,598 B2 * | 5/2011 | Kasamsetty | G11C 7/1018 365/230.03 |
| 8,558,594 B2 * | 10/2013 | Tang | G06F 1/32 327/218 |
| 8,588,015 B2 * | 11/2013 | Chang | G11C 7/22 365/194 |
| 8,913,440 B2 * | 12/2014 | Tao | G11C 11/419 365/185.11 |
| 9,361,959 B2 * | 6/2016 | Bhatia | G11C 7/222 |
| 9,478,269 B2 * | 10/2016 | Tao | G11C 11/419 |
| 9,569,305 B2 * | 2/2017 | Mukai | G06F 11/1048 |
| 9,779,804 B2 * | 10/2017 | Oh | G11C 7/1021 |
| 2005/0268023 A1 | 12/2005 | Briggs et al. | |
| 2007/0143677 A1 | 6/2007 | Pyeon et al. | |
| 2010/0005244 A1 * | 1/2010 | Weiberle | G06F 11/1658 711/130 |
| 2014/0056093 A1 | 2/2014 | Tran et al. | |

* cited by examiner

SEMICONDUCTOR INTEGRATED CIRCUIT

CROSS REFERENCE TO RELATED APPLICATIONS

This application is based upon and claims the benefit of priority from the prior Japanese Patent Application No. 2017-179448 filed on Sep. 19, 2017, the entire contents of which are incorporated herein by reference.

FIELD

Embodiments described herein relate generally to semiconductor integrated circuits.

BACKGROUND

A programmable logic device (hereinafter also referred to as a PLD) is a semiconductor integrated circuit capable of rewriting its circuit configuration after the chip manufacturing, and a typical example of such a PLD is a field programmable gate array (hereinafter also referred to as an FPGA). An island-style PLD has a two-dimensionally repetitive configuration in which a configurable logic block and a configurable memory block are connected to each other by a configurable interconnect block. Each configurable memory block is preferably capable of supplying data to the corresponding configurable logic block at a higher data rate (bits/sec). The data rate is determined by the product of the data transfer clock frequency $f_{clk}$ and the data bit width W. The data transfer clock speed is normally limited by the maximum read clock frequency of the memory core included in the configurable memory block. Meanwhile, the data bit width is limited by the number of I/Os in the configurable block connecting the configurable memory block and the configurable interconnect block. Each of the I/Os in the configurable block has a large area due to the configurability thereof, and an increase in the number of I/Os causes a significant increase in area.

DETAILED DESCRIPTION

A semiconductor integrated circuit according to an embodiment includes: a first memory bank that performs a read operation in accordance with a first clock signal, and outputs first data in accordance with the first clock signal; a second memory bank that performs a read operation in accordance with the first clock signal, and outputs second data in accordance with the first clock signal; a configurable decoder that supplies address information to the first memory bank and the second memory bank; and an output module reconfigurable in one of a first mode and a second mode, the first mode including a function of holding the first data and the second data in accordance with the first clock signal, and selecting and outputting the first data or the second data in accordance with a second clock signal having a frequency at least twice higher than the first clock signal, the second mode including at least a function of selecting and outputting the first data or the second data in accordance with the first clock signal.

First Embodiment

Figure 1:
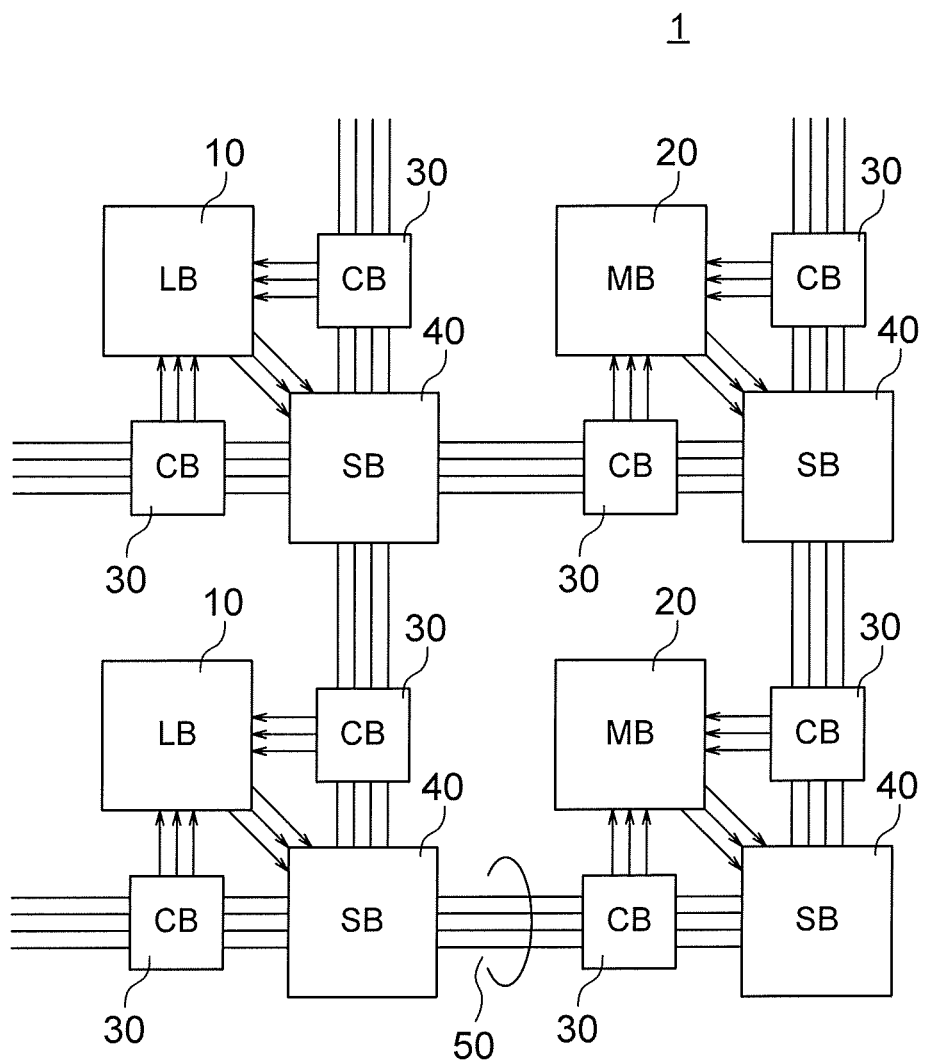
FIG. 1 is a block diagram showing the configuration of a semiconductor integrated circuit according to a first embodiment.

Referring to FIGS. 1 through 8, a semiconductor integrated circuit according to a first embodiment is described. The semiconductor integrated circuit of this embodiment includes an island-style programmable logic device (hereinafter also referred to as the PLD), and the architecture of this PLD is shown in FIG. 1.

The PDL 1 includes configurable logic blocks (hereinafter also referred to as LBs) 10, configurable memory blocks (hereinafter also referred to as MBs) 20, configurable connection blocks (hereinafter also referred to as CBs) 30, and configurable switch blocks (hereinafter also referred to as SBs) 40.

Each configurable logic block 10 receives a signal from the corresponding configurable connection block 30, and sends the signal to the corresponding configurable switch block 40.

Each configurable memory block 20 receives a signal from the corresponding configurable connection block 30, and sends the signal to the corresponding configurable switch block 40.

The configurable switch blocks 40 are connected to one another by interblock wiring lines 50 via the configurable connection blocks 30. Each configurable connection block 30 includes a multiplexer (not shown) having an input terminal connected to the interblock wiring lines 50, and, in accordance with circuit configuration information, outputs the signal of a selected wiring line of the interblock wiring lines 50 to the corresponding configurable logic block 10 or the corresponding configurable memory block 20.

Each configurable switch block 40 includes a multiplexer (not shown) connected to one of the interblock wiring lines 50, selects an output from the corresponding configurable logic block 10 or the corresponding configurable memory block 20 in accordance with circuit configuration information, and outputs the selected signal to another interblock wiring line 50.

In this embodiment, each configurable connection block 30 and the corresponding configurable switch block 40 are collectively referred to as a configurable interconnect block. That is, in this embodiment, each configurable logic block 10 and the corresponding configurable memory block 20 are connected to each other by a configurable interconnect block.

(Overview of a Memory Module)

Figure 2:
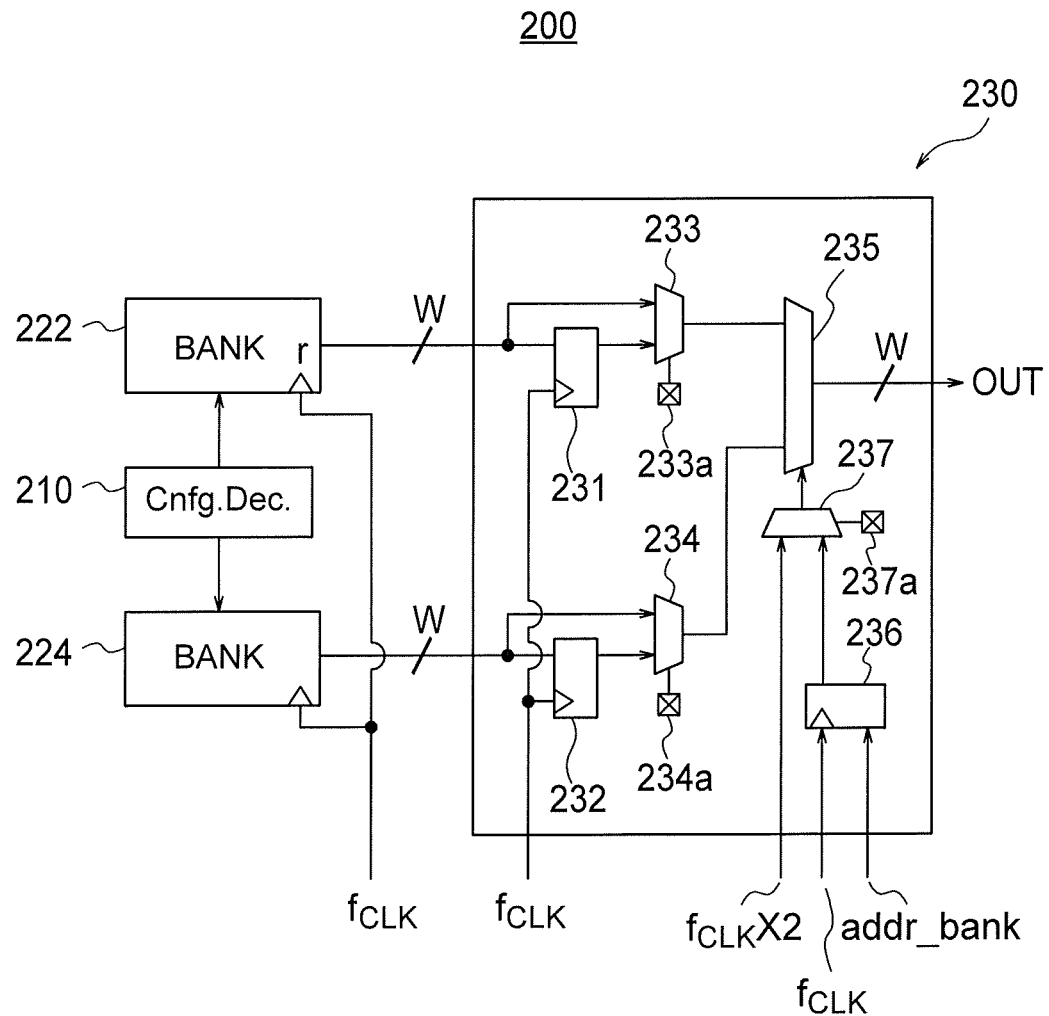
FIG. 2 is a circuit diagram showing a configurable memory module according to the first embodiment.

Each configurable memory block 20 includes a configurable memory module, and an example overview of the configurable memory module is shown in FIG. 2.

The configurable memory module 200 includes a configurable decoder 210, two random access memory (RAM) banks 222 and 224, and a configurable output module 230. The configurable decoder 210 sends address information to each of the RAM banks 222 and 224.

The configurable output module 230 includes bank registers 231 and 232, configurable multiplexers 233 and 234, configuration static random access memories (SRAMs) 233a and 234a, a bank selection multiplexer 235, a bank selection address register 236, a mode selection multiplexer 237, and a configuration SRAM 237a. The bank register 231 is formed with a flip-flop, for example. The bank register 231 holds data having a width W sent from the RAM bank 222 in accordance with a clock signal $f_{CLK}$, and also sends the data to the configurable multiplexer 233.

The bank register 232 is formed with a flip-flop, for example. The bank register 232 holds data having the width W sent from the RAM bank 224 in accordance with the clock signal $f_{CLK}$, and also sends the data to the configurable multiplexer 234.

The configurable multiplexer 233 selects the data sent from the RAM bank 222 or the data sent from the bank register 231, in accordance with an input signal sent from the configuration SRAM 233a, and outputs the selected data to the bank selection multiplexer 235. The configurable multiplexer 234 selects the data sent from the RAM bank 224 or the data sent from the bank register 232, in accordance with an input signal sent from the configuration SRAM 234a, and outputs the selected data to the bank selection multiplexer 235. That is, the configurable multiplexers 233 and 234 have a function of bypassing the bank registers 231 and 232, respectively, and are also referred to as bypass multiplexers.

The bank selection address register 236 is formed with a flip-flop, for example. The bank selection address register 236 holds an address addr_bank for selecting one of the two RAM banks 222 and 224 in accordance with the clock signal $f_{CLK}$, and outputs the held address.

In accordance with the data held in the configuration SRAM 237a, the mode selection multiplexer 237 selects the output of the bank selection address register 236, a clock signal having a clock frequency (hereinafter also referred to as the clock speed) $f_{CLK}$, or a clock signal $f_{CLK} \times 2$ having a speed $2 \times f_{CLK}$ that is twice the clock speed $f_{CLK}$, and sends the selected signal as an input signal to the bank selection multiplexer 235.

In this embodiment and the embodiments described later, a clock signal having a speed at least twice the clock speed $f_{CLK}$ may be used instead of the clock signal $f_{CLK} \times 2$ having the speed $2 \times f_{CLK}$ twice the clock speed $f_{CLK}$.

In accordance with the input signal sent from the mode selection multiplexer 237, the bank selection multiplexer 235 selects the output of one of the configurable multiplexers 233 and 234, and outputs the selected output from the configurable output module 230.

The configurable decoder 210, the multiplexers 233 and 234, and the mode selection multiplexer 237 have configurability (reconfigurability), and the reconfigurability is determined by circuit configuration information (circuit configuration data) held in a configuration SRAM.

Figure 3:
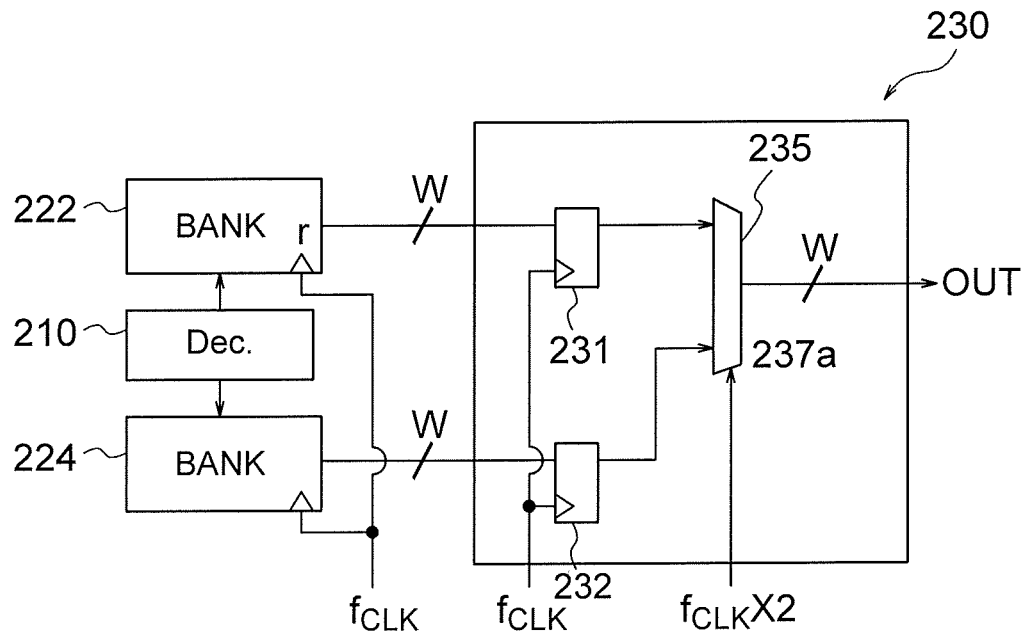
FIG. 3 is a circuit diagram showing a double data rate mode of the configurable memory module according to the first embodiment.
Figure 4:
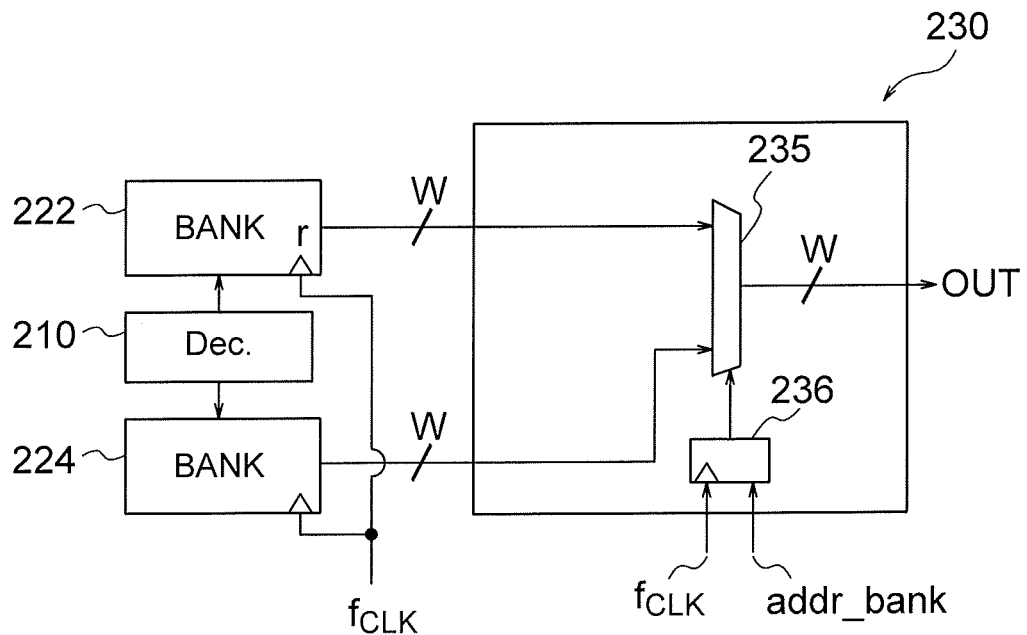
FIG. 4 is a circuit diagram showing a normal mode of the configurable memory module according to the first embodiment.

The entire configurable memory module 200 can be reconfigured in the double data rate mode shown in FIG. 3 or in the normal mode shown in FIG. 4, in accordance with the circuit configuration information held in the configuration SRAM.

In the double data rate mode shown in FIG. 3, the bank registers 231 and 232 are selected by the bypass multiplexers 233 and 234, respectively. Both sets of the data held in the bank registers 231 and 232 are input to the bank selection multiplexer 235, and are alternately output from the bank selection multiplexer 235 at the clock speed $2 \times f_{CLK}$, which is twice the clock speed $f_{CLK}$.

In the normal mode shown in FIG. 4, on the other hand, the RAM banks 222 and 224 are selected by the bypass multiplexers 233 and 234. The data held in the RAM bank 222 or the data held in the RAM bank 224 is selected by the bank selection multiplexer 235, and is output from the bank selection multiplexer 235 at the clock speed $f_{CLK}$.

That is, in the double data rate mode, a maximum data transfer rate twice higher than that in the normal mode can be achieved.

In the double data rate mode, the configurable output module 230 halves the data width and doubles the speed of the data transfer clock. That is, the configurable output module 230 is reconfigured as a W-down/$f_{CLK}$-up converter. In the normal mode, on the other hand, the configurable output module 230 is reconfigured as a bank selector that selects one of the RAM banks 222 and 224 in accordance with a bank selection address.

The configurable decoder 210 can be reconfigured in a shared mode for supplying address information simultaneously to the two RAM banks 222 and 224, or in an exclusive mode for selecting one of the two RAM banks 222 and 224 in accordance with a bank selection address signal and supplying address information exclusively to the selected RAM bank. The configurable decoder 210 is reconfigured in the shared mode at a time of the double data rate mode, and is reconfigured in the exclusive mode at a time of the normal mode.

The RAM bank 222 and the RAM bank 224 are conventional RAM banks that perform a read or write operation for an address supplied to a port. Each of the RAM banks 222 and 224 is a dual port bank with two ports. That is, each of the RAM banks 222 and 224 can simultaneously access the addresses of the two ports. The RAM banks 222 and 224 each have a memory cell array therein. Each cell in this memory cell array may be a dual port SRAM cell formed with eight transistors, for example, or may be a dual port MTJ cell formed with two transistors and one magnetic tunnel junction (MTJ) element (see "High Density, Low Energy, Magnetic Tunnel Junction Based Block RAMs for Memory-rich FPGAs", IEEE International Conference on Field-Programmable Technology (FPT), pp. 4-11 (2016), K. Tatsumura, S. Yazdanshenas, and V. Betz, for example). Alternatively, each cell may be a dual port MTJ element cell formed with four transistors and one MTJ element. Each of the RAM banks 222 and 224 may be a single port bank having one port. In this case, each cell may be a single port SRAM cell formed with six transistors, or may be a single port MTJ cell formed with one transistor and one MTJ element.

In this embodiment, the number of RAM banks is two. The number of RAM banks may be a multiple of 2, such as four, six, or eight, which is greater than two.

The maximum data width of the RAM bank 222 and the RAM bank 224 at a time of reading or writing is W. The maximum data width W of a RAM bank is determined by the number of bit line drivers (read sense amplifiers and write drivers) held by the RAM bank.

The maximum read clock frequency of the RAM bank 222 and the RAM bank 224 is the frequency $f_{CLK}$ of the clock signal $f_{CLK}$. In this embodiment, the clock signal $f_{CLK}$ is supplied to the read ports of the RAM bank 222 and the RAM bank 224.

The bank registers 231 and 232 each include W flip-flops (F/Fs), and can hold read data (Dout) from the banks 222 and 224, respectively. The clock signal $f_{CLK}$ is supplied to the bank 222 and the bank register 231, and the bank 224 and the bank register 232.

The bypass multiplexer 233 is connected to the output terminal (W bits) of the RAM bank 222 and the output terminal (W bits) of the bank register 231, selects read data (non-registered) output directly from the RAM bank 222 or output data (registered) output via the bank register 231, and outputs the selected data (the output data width being W bits). The bypass multiplexer 234 is connected to the output terminal (W bits) of the RAM bank 224 and the output terminal (W bits) of the bank register 232, selects read data (non-registered) output directly from the RAM bank 224 or output data (registered) output via the bank register 232, and outputs the selected data (the output data width being W bits). The bypass multiplexer 233 is reconfigured to select the output data via the bank register 231 in the double data rate mode, and select the read data output directly from the RAM bank 222 in the normal mode. The bypass multiplexer 234 is reconfigured to select the output data via the bank register 232 in the double data rate mode, and select the read data output directly from the RAM bank 224 in the normal mode.

The bank selection address register 236 holds a bank selection address signal addr_bank at the clock rate of $f_{CLK}$.

The mode selection multiplexer 237 is connected to the feeder line of the clock signal $f_{CLK} \times 2$ having a speed twice higher than the clock signal $f_{CLK}$ and to the output of the bank selection address register 236, and outputs one of the two outputs in accordance with circuit configuration information. The mode selection multiplexer 237 selects the signal $f_{CLK} \times 2$ in the double data rate mode, and selects the bank selection address signal addr_bank in the normal mode.

The output (W bits) of the bank bypass multiplexer 233 and the output (W bits) of the bank bypass multiplexer 234 are connected to the bank selection multiplexer 235, and one of the two outputs is output from an output terminal OUT (the output data width being W), in accordance with an output signal from the mode selection multiplexer 237.

In the double data rate mode, the bank selection multiplexer 235 alternately outputs the output of the bank bypass multiplexer 233 and the output of the bank bypass multiplexer 234 every clock cycle ($1/(f_{CLK} \times 2)$) of the signal $f_{CLK} \times 2$, from the output terminal OUT. In the normal mode, on the other hand, the bank selection multiplexer 235 selects the output of the bank bypass multiplexer 233 or the output of the bank bypass multiplexer 234 in accordance with a bank address signal addr_bank every clock cycle ($1/f_{CLK}$) of the clock signal $f_{CLK}$, and outputs the selected output from the output terminal OUT.

(Details of the Configurable Memory Module 200)

Figure 5:
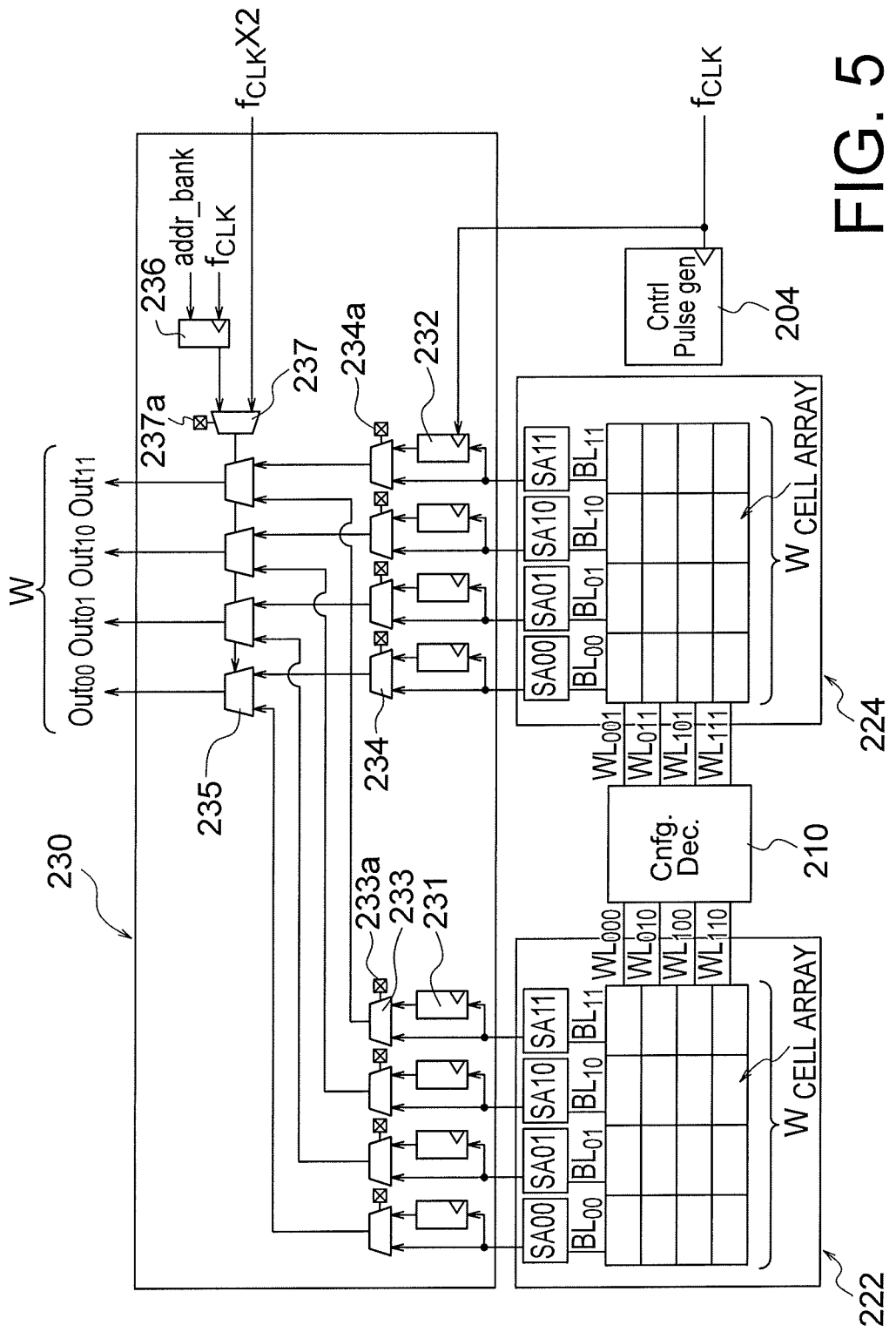
FIG. 5 is a circuit diagram showing details of an example of the configurable memory module according to the first embodiment.

FIG. 5 shows details of an example of the configurable memory module 200. In this example, the logical width/depth each of the banks 222 and 224 is 4 bits/4 words (4×4 array). That is, the maximum data width (W) is 4 bits, and the depth is 4 words. The bank 222 includes a cell array formed with four rows and four columns, four word lines $WL_{000}$, $WL_{010}$, $WL_{100}$, and $WL_{110}$, four bit lines $BL_{00}$, $BL_{01}$, $BL_{10}$, and $BL_{11}$ and sense amplifiers $SA_{00}$, $SA_{01}$, $SA_{10}$, and $SA_{11}$. The bank 224 includes a cell array formed with four rows and four columns, four word lines $WL_{001}$, $WL_{011}$, $WL_{101}$, and $WL_{111}$, four bit lines $BL_{00}$, $B_{01}$, $BL_{10}$, and $BL_{11}$ and sense amplifiers $SA_{00}$, $SA_{01}$, $SA_{10}$, and $SA_{11}$. The word lines of the banks 222 and 224 are connected to the configurable decoder 210. The bit lines $BL_{00}$, $BL_{01}$, $BL_{10}$, and $BL_{11}$ are connected to the input terminals of the read sense amplifiers $SA_{00}$, $SA_{01}$, $SA_{10}$, and $SA_{11}$, respectively.

The sense amplifiers $SA_{00}$, $SA_{01}$, $SA_{10}$, and $SA_{11}$ of the RAM bank 222 are connected to bank selection multiplexers 235 via bank bypass multiplexers 233 accompanied by bank registers 231, respectively. Meanwhile, the sense amplifiers $SA_{00}$, $SA_{01}$, $SA_{10}$, and $SA_{11}$ of the RAM bank 224 are connected to bank selection multiplexers 235 via the bank bypass multiplexers 234 accompanied by the bank registers 232, respectively. Here, each of the bank registers 231 and 232 is a 1-bit flip-flop (F/F). The bank registers 231 include a total of W (four) flip-flops (F/F). Each bank register 232 is a 1-bit flip-flop (F/F). The bank registers 232 include a total of W (four) flip-flops (F/F).

Each of the bypass multiplexers 233 and 234 of the RAM banks 222 and 224 is a two-to-one (2-bit input and 1-bit output) configurable multiplexer. The bypass multiplexers 233 and 234 of the RAM banks 222 and 224 each include W (four) two-to-one configurable multiplexers. In FIG. 5, each of the bypass multiplexers 233 and 234 has individual circuit configuration information. Alternatively, all the bypass multiplexers 233 may share the same circuit configuration information, and all the bypass multiplexers 234 may share the same circuit configuration information.

Each of the bank selection multiplexers 235 is a two-to-one multiplexer. The bank selection multiplexers 235 include a total of W (four) two-to-one multiplexers. In each of the bank selection multiplexers 235, the output of the mode selection multiplexer 237 is connected to a control signal (input signal) terminal of the two-to-one multiplexer.

The configurable memory module 200 further includes the bank registers 231 and 232, and a control pulse generator 204 that generates internal control signals of the RAM banks 222 and 224. The clock signal $f_{CLK}$ is supplied to the control pulse generator 204, and the clock signal $f_{CLK} \times 2$ having a frequency twice the frequency of the clock signal $f_{CLK}$ is supplied to the mode selection multiplexer 237. Two clocks that are the clock signal $f_{CLK}$ and the clock signal $f_{CLK} \times 2$ may be supplied from the outside of the configurable memory module 200. Alternatively, the clock signal $f_{CLK} \times 2$ may be supplied from the outside, and the clock signal $f_{CLK}$ may be internally generated from the clock signal $f_{CLK} \times 2$ by a ½ frequency divider.

(Configurable Decoder 210)

Figure 6:
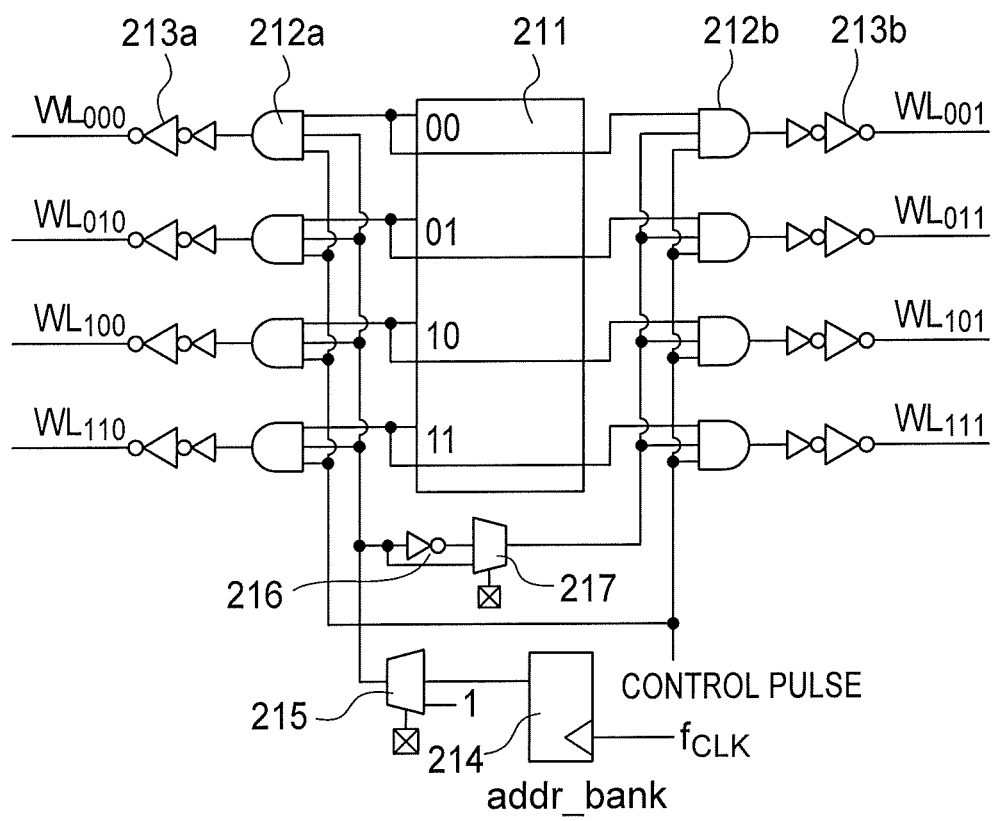
FIG. 6 is a circuit diagram showing details of an example of a configurable decoder according to the first embodiment.

FIG. 6 shows details of an example of the configurable decoder 210. The configurable decoder 210 in this example drives two 4-word RAM banks. The configurable decoder 210 in this example includes a two-to-four address decoder 211, control gates 212a and 212b, word line drivers 213a and 213b, a bank selection address register 214 that holds a bank selection address (addr_bank), a mode selection multiplexer 215, an inverter 216, and a bypass multiplexer 217.

The decoder 211 decodes a 2-bit address signal into a 4-bit decoded signal (00, 01, 10, 11).

The control gates 212a and 212b are AND gates that perform an AND operation using three elements, which are the decoded signal, a control pulse from the control pulse generator 204 shown in FIG. 5, and a bank selection signal, and the outputs of the AND gates are connected to the word line drivers 213a and 213b.

The bank selection address register 214 has the same configuration as the registers 231 of the same name included in the configurable output module 230 shown in FIG. 5.

The mode selection multiplexer 215 selects and outputs the output of the bank selection address register 214 or a terminal of a fixed logical value 1, in accordance with circuit configuration information. In the double data rate mode, the terminal of the fixed logical value 1 is selected. In the normal mode, the output of the bank selection address register 214 is selected.

The bypass multiplexer 217 selects and outputs the output of the mode selection multiplexer 215 or a signal obtained by inverting the output of the mode selection multiplexer 215 by the inverter 216, in accordance with circuit configuration information. In the double data rate mode, the output of the mode selection multiplexer 215 is selected. In the normal mode, the output of the inverter 216 is selected.

The output of the mode selection multiplexer 215 is connected to the control gates 212a on the side of the RAM bank 222. Meanwhile, the output of the bypass multiplexer 217 is connected to the control gates 212b on the side of the RAM bank 224.

At a time of the double data rate mode, the entire configurable decoder 210 is reconfigured in a shared mode for supplying address information simultaneously to the two RAM banks 222 and 224. At a time of the normal mode, the entire configurable decoder 210 is reconfigured in an exclusive mode for selecting one of the two RAM banks 222 and 224 in accordance with a bank selection address signal, and supplying address information exclusively to the selected RAM bank.

Figure 7:
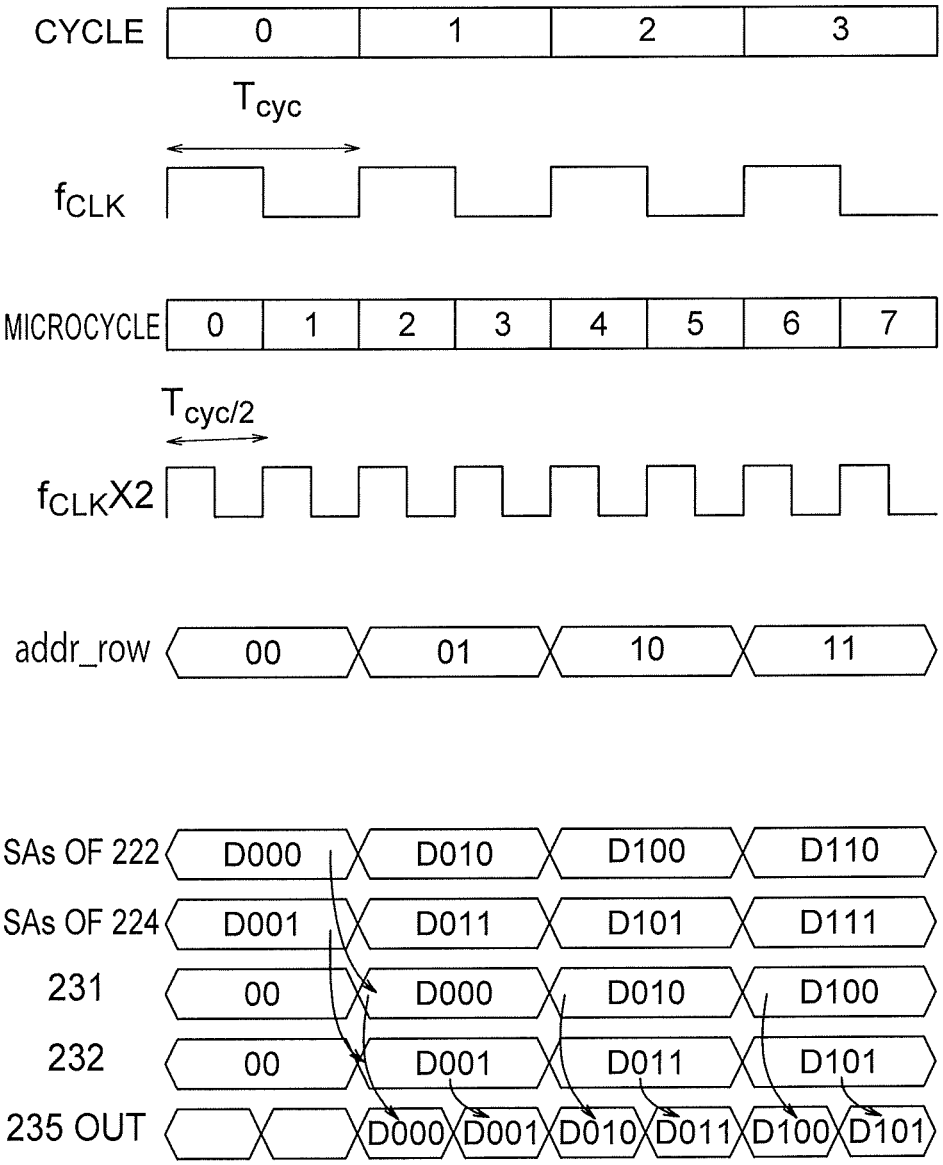
FIG. 7 is a waveform chart showing a timing chart of the double data rate mode of the configurable memory module according to the first embodiment.

FIG. 7 shows a timing chart of the double data rate mode. This timing chart shows operations of four cycles, which are operations of cycle 0, cycle 1, cycle 2, and cycle 3, on the basis of the clock signal $f_{CLK}$ to be supplied to the RAM banks 222 and 224. In a case where the clock signal $f_{CLK} \times 2$ is used as a reference, the timing chart shows operations of eight cycles, which are operations of microcycle 0 through microcycle 7.

In the cycle 0, the RAM banks 222 and 224 simultaneously perform a read operation, and read data D000 and data D001. Of the three bits of data, the first two bits represent a row address addr_row, and the last one bit represents a bank selection address. In the read operation, the RAM bank 222 and the RAM bank 224 can use a cycle time (Tcyc=$1/f_{CLK}$) equivalent to the reciprocal of the frequency of the clock signal $f_{CLK}$.

At the rise of the clock signal $f_{CLK}$ in the cycle 1, the bank register 231 acquires the data D000, and the bank register 232 acquires the data D001. The bank register 231 and the bank register 232 hold the values during the cycle 1. In the microcycle 2 and the microcycle 3, which belong to the cycle 1, the bank selection multiplexer 235 sequentially outputs the data D000 and the data D001.

In the cycle 1, the RAM bank 222 and the RAM bank 224 simultaneously perform a read operation, to read data D010 and data D011, respectively. In the microcycle 4 and the microcycle 5, which belong to the cycle 2, the bank selection multiplexer 235 sequentially outputs the data D010 and data D011.

The data transfer rate of the output signal (OUT) of the bank selection multiplexer 235 is $W \times f_{CLK} \times 2$, because the bit width is W, and the data transfer clock is $f_{CLK} \times 2$.

Figure 8:
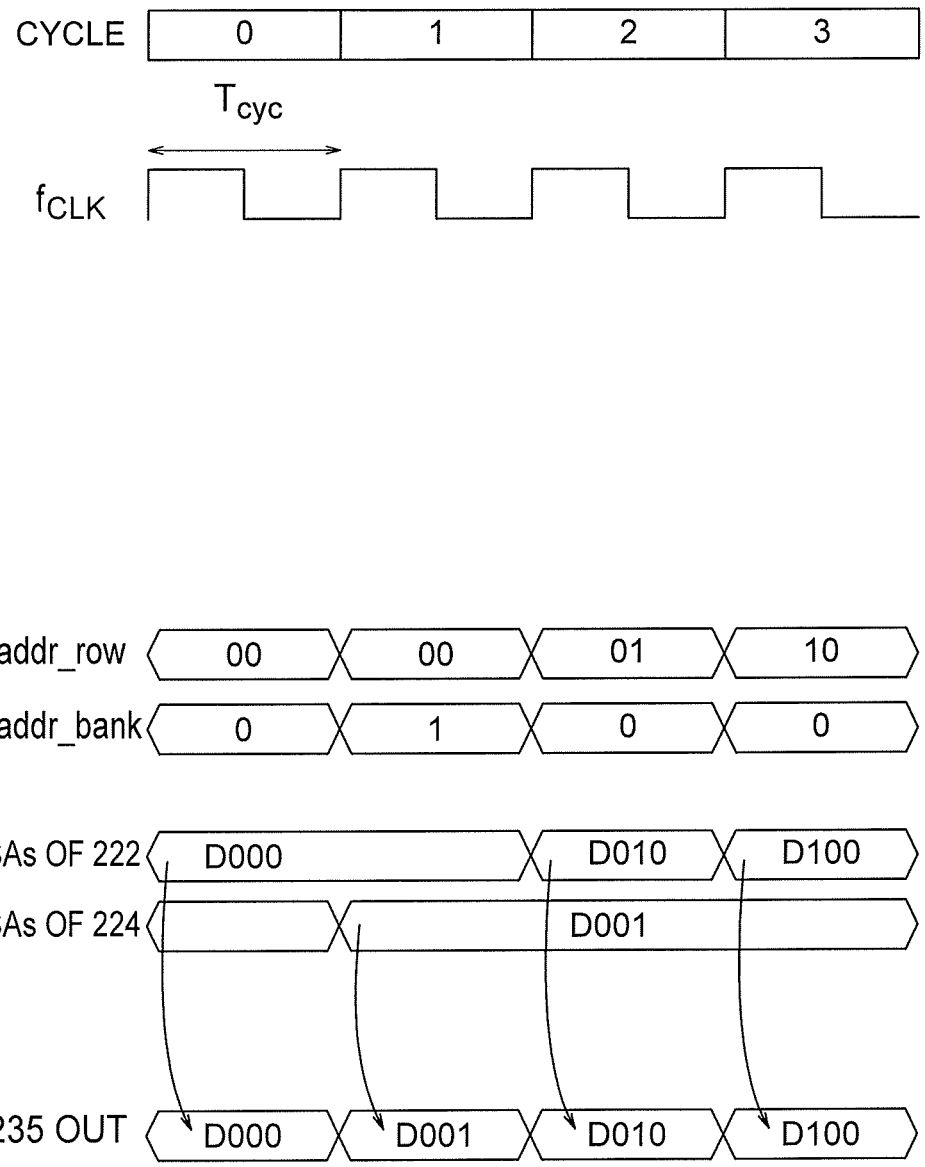
FIG. 8 is a waveform chart showing a timing chart of the normal mode of the configurable memory module according to the first embodiment.

FIG. 8 shows a timing chart of the normal mode. FIG. 8 shows operations of four cycles, which are operations of cycle 0, cycle 1, cycle 2, and cycle 3, on the basis of the clock $f_{CLK}$ to be supplied to the RAM banks 222 and 224. The bank selection address registers 214 and 236 included in the configurable decoder 210 and the configurable output module 230 acquire a bank selection address signal "0" at the rise of the clock signal $f_{CLK}$ in the cycle 0, and hold the value during the cycle 0.

In cycle 0, the RAM bank 222 performs a read operation, and reads data D000. In the read operation, the RAM bank 222 can use a cycle time (Tcyc=$1/f_{CLK}$) equivalent to the reciprocal of the clock cycle $f_{CLK}$.

The bank selection address registers 214 and 236 acquire a bank selection address signal "1" at the rise of the clock $f_{CLK}$ in the cycle 1, and hold the value during the cycle 1. In the cycle 1, the RAM bank 224 performs a read operation, and reads data D001. The bank selection multiplexer 235 outputs data D000 in the cycle 0, and outputs the data D001 in the cycle 1. The data transfer rate of the output signal (OUT) of the bank selection multiplexer 235 is $W \times f_{CLK}$, because the bit width is W, and the data transfer clock is $f_{CLK}$.

As shown in FIGS. 7 and 8, according to this embodiment, it is possible to obtain a configurable memory module that supports not only a configuration mode with a normal data transfer rate but also the double data rate mode that enables operation at a maximum data transfer rate twice higher than the normal data transfer rate. In forming a double data rate module, there is no need to increase the data width W of the output terminal OUT of the configurable output module 230, and there is no need to increase the frequency $f_{CLK}$ of the maximum read clock for the RAM bank 222 and the RAM bank 224.

According to the principles of this embodiment, in the double data rate mode, the data transfer rate can be increased by causing the two RAM banks 222 and 224 to simultaneously perform read operations. Meanwhile, at the output terminal OUT of the configurable output module 230, the number of output terminals is not increased, but the data transfer clock frequency is doubled to enable a transfer of an increased amount of data.

As described above, it is possible to provide a semiconductor integrated circuit that includes configurable memory blocks capable of increasing the data transfer rate without an increase in the number of I/Os.

Second Embodiment

Figure 9:
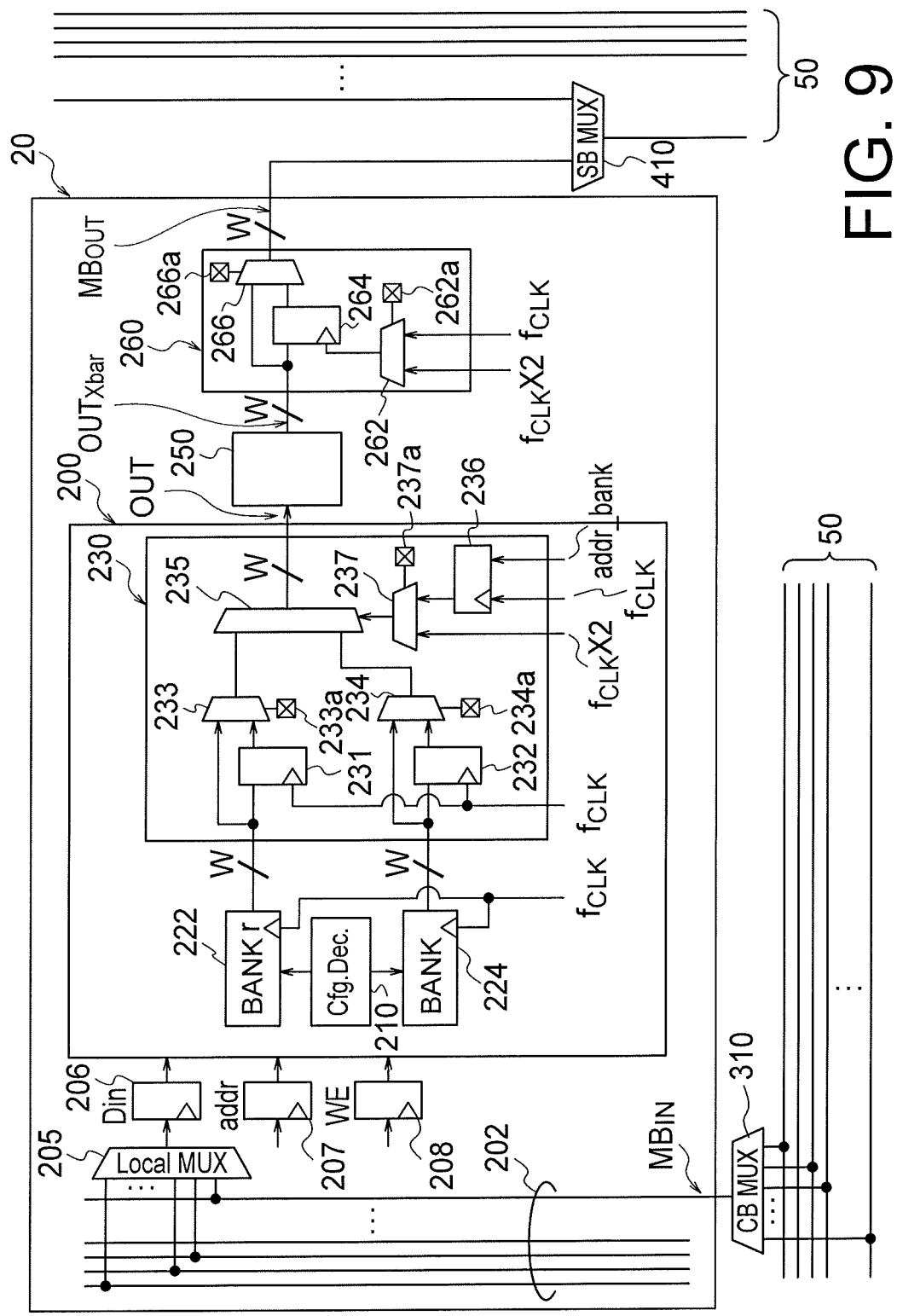
FIG. 9 is a circuit diagram showing a configurable memory block of a semiconductor integrated circuit according to a second embodiment.

Referring now to FIG. 9, a semiconductor integrated circuit according to a second embodiment is described. The semiconductor integrated circuit of the second embodiment has the same configuration as the semiconductor integrated circuit of the first embodiment, except that each configurable memory block 20 is replaced with a configurable memory block 20 shown in FIG. 9.

The configurable memory block 20 of the second embodiment includes local wiring lines 202, a local multiplexer 205, input registers 206, 207, and 208, a configurable memory module 200, an output crossbar 250, and a configurable output register 260.

A signal selectively captured by a multiplexer 310 of the corresponding configurable connection block 30 from the interblock wiring lines 50 is input to the local wiring lines 202 of the configurable memory block 20. The number of input terminals $MB_{IN}$ of the memory block 20 is equal to the number of the multiplexers in the connection block 30 or the number of the local wiring lines 202. To increase the number of the input terminals $MB_{IN}$ of the memory block 20, it is necessary to increase the number of multiplexers in the connection block 30 that occupies a large area.

The local multiplexer 205 is connected to the local wiring lines 202, and outputs a signal selected from the local wiring lines 202 to the input registers 206, 207, and 208, in accordance with circuit configuration information.

The input register 206 holds input data (Din), the input register 207 holds a read or write address, and the input register 208 holds a write enable signal.

The configurable memory module 200 is the same as the configurable memory module 200 shown in FIG. 2. The configurable memory module 200 includes two RAM banks 222 and 224, and the maximum data width of the RAM bank 222 and the RAM bank 224 at a time of reading and writing is W.

The data width of the output terminal OUT of the configurable memory module 200 is W per port. In FIG. 9, only the output terminal of one port is shown. The second port also has an output terminal with the width W. Accordingly, the data width of the output terminal of the configurable memory module 200 is 2W, with the output terminals of the two ports being combined. The frequency of the maximum read clock of the RAM bank 222 and the RAM bank 224 is $f_{CLK}$.

The output terminal of the configurable memory module 200 is connected to the input terminal of the output crossbar 250. The output terminal of this configurable memory module 200 has a data width 2W, with the two ports being combined. The data width of the output terminal $OUT_{Xbar}$ of the output crossbar 250 is W. The output crossbar 250 is a switch matrix that includes an input terminal with the data width 2W and an output terminal with the data width W. The output crossbar 250 realizes desired switching of connection between an input line and an output line in accordance with circuit configuration information.

The configurable output register 260 is an output register including a bypass multiplexer, and its data width is W. Specifically, the configurable output register 260 includes a configurable multiplexer 262, W flip-flops 264, and a bypass multiplexer 266. Reference numerals 262a and 266a indicate configuration SRAMs of the configurable multiplexer 262 and the bypass multiplexer 266, respectively, and circuit configuration information is held in the configuration SRAMs 262a and 266a.

The output terminal of the configurable output register 260 is equivalent to the output terminal $MB_{OUT}$ of the memory block 20, and its data width is W. One of the output terminals of the memory block 20 may be connected to multiplexers in the corresponding switch block 40. The connecting wire in this case is also called a broadcast wire.

To increase the number of output terminals of the memory block 20, it is necessary to increase the size of the output crossbar 250, the number of configurable output registers 260, and the number of multiplexers in the switch block 40. This involves a large increase in the occupied area.

The clock input terminal of an output register 264 of the configurable output register 260 is connected to the output terminal of the configurable multiplexer 262 capable of selecting a clock signal $f_{CLK} \times 2$ or a clock signal $f_{CLK}$. In the double data rate mode, the clock signal $f_{CLK} \times 2$ is selected. In the normal mode, the clock signal $f_{CLK}$ is selected.

As described above, according to this embodiment, the configurable memory module 200 is disposed in the memory block 20, or in the region between the input terminals $MB_{IN}$ and the output terminal $MB_{OUT}$. In this manner, it is possible to form a memory block that supports not only a configuration mode with a normal data transfer rate but also the double data rate mode that enables operation at the maximum data transfer rate twice higher than the normal data transfer rate, without an increase in the number of output terminals $MB_{OUT}$.

As described above, like the first embodiment, the second embodiment can provide a semiconductor integrated circuit that includes configurable memory blocks capable of increasing the data transfer rate without an increase in the number of I/Os.

Third Embodiment

Figure 10:
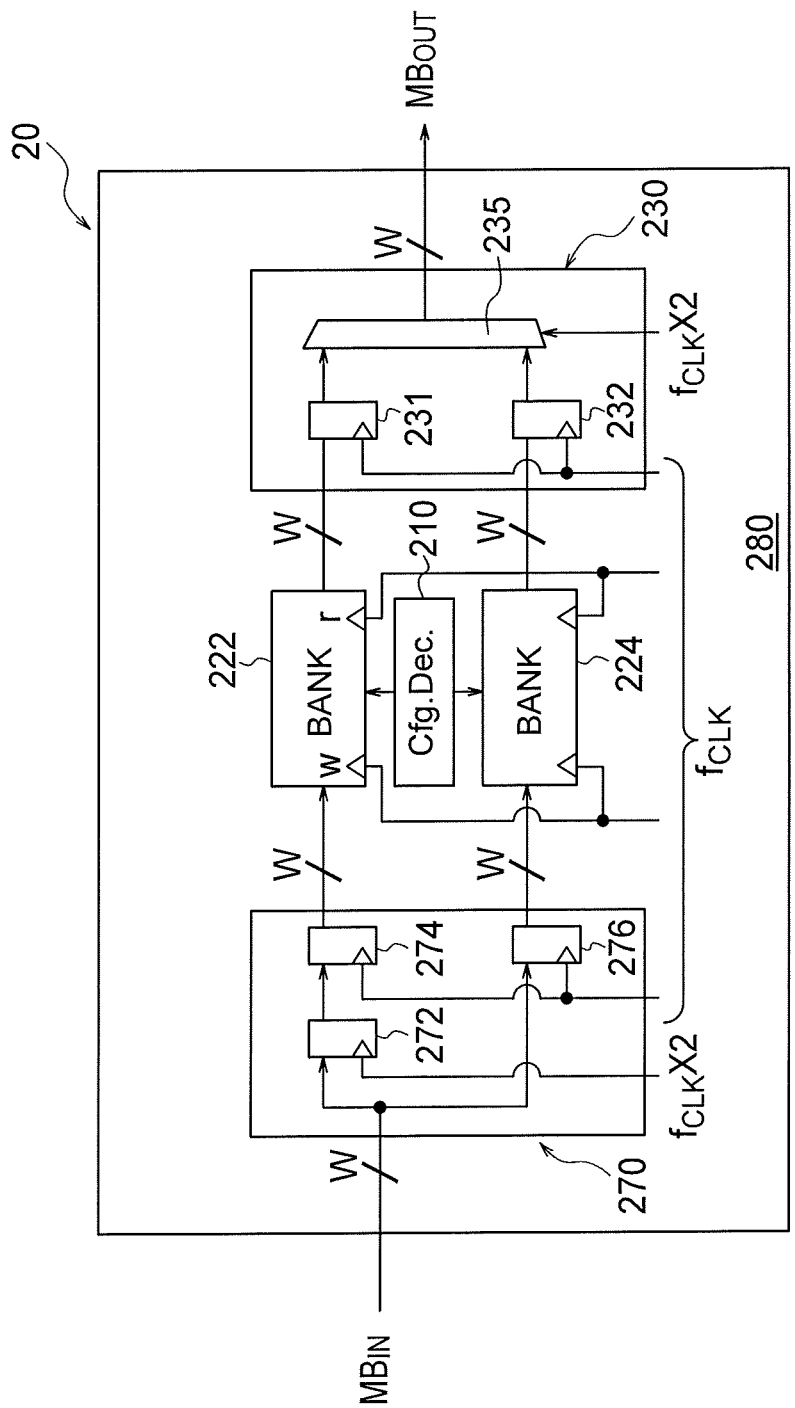
FIG. 10 is a circuit diagram showing a configurable memory block of a semiconductor integrated circuit in a double data rate flip-flop mode according to a third embodiment.
Figure 11:
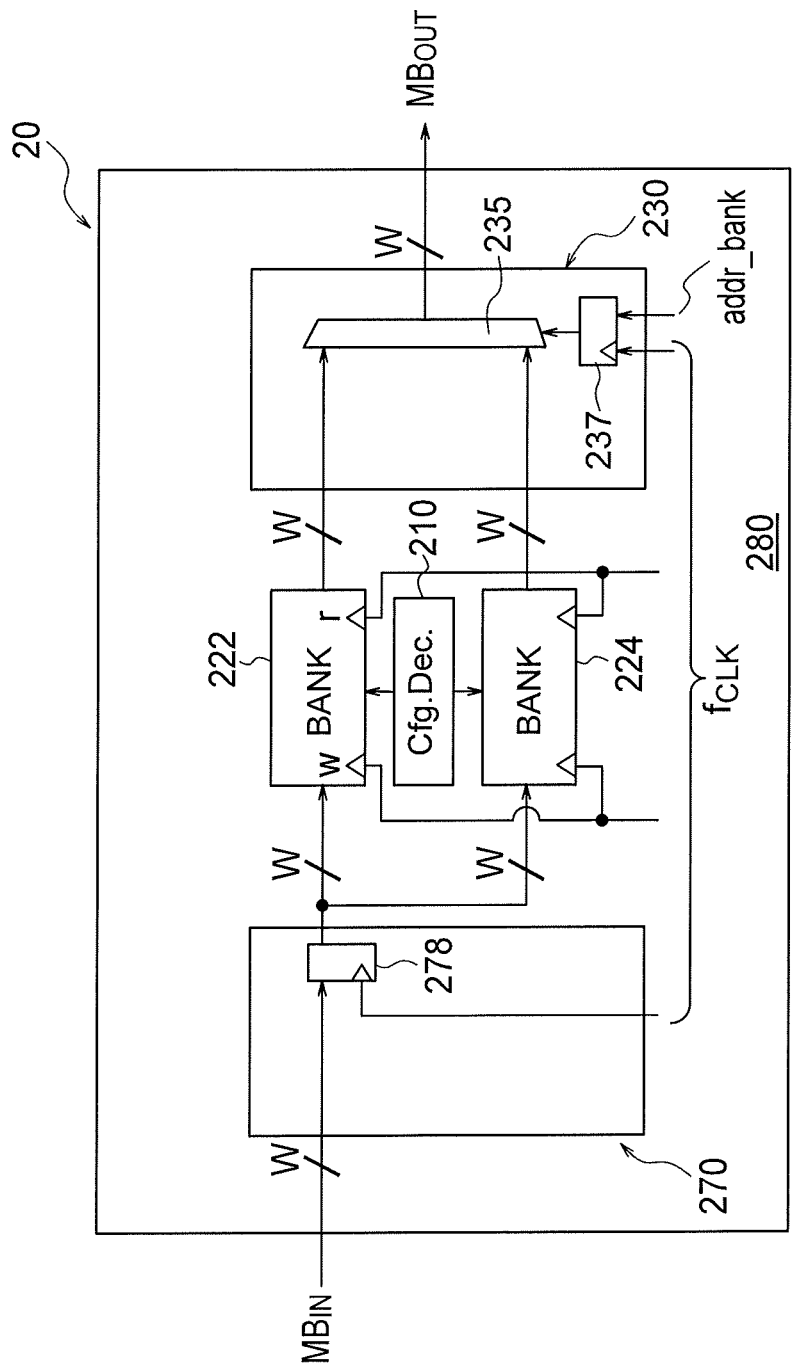
FIG. 11 is a circuit diagram showing the configurable memory block of the semiconductor integrated circuit in a normal flip-flop mode according to the third embodiment.

Referring now to FIGS. 10 and 11, a semiconductor integrated circuit according to a third embodiment is described. The semiconductor integrated circuit of the third embodiment has the same configuration as the semiconductor integrated circuit of the first embodiment, except for further including a configurable input module 270 in each configurable memory block 20.

A configurable memory block 20 according to the third embodiment includes a configurable input module, a memory bank unit, and a configurable output module. The memory bank unit 280 includes the configurable decoder 210, the RAM bank 222, and the RAM bank 224, which have been described in the first and second embodiments. The configurable decoder 210, the RAM bank 222, and the RAM bank 224 have the same configurations and functions as those of the configurable decoder 210, the RAM bank 222, and the RAM bank 224, which have been described in the first and second embodiments. The configurable output module also has the same configuration as the configurable output module 230 described in the first embodiment.

The configurable input module has a function of being reconfigured in a double data rate mode or in a normal mode.

In the double data rate mode, the configurable input module 270 includes registers 272, 274, and 276, as shown in FIG. 10. The configurable register 272 is a flip-flop, and operates in accordance with a clock signal $f_{CLK} \times 2$. In the register 272, an input terminal having a data width W is connected to an input terminal $MB_{IN}$ having the data width W of the configurable memory block 20, and an output terminal having the data width W is connected to an input terminal having the data width W of the register 274. The register 274 is a flip-flop, and operates in accordance with a clock signal $f_{CLK}$. In the register 274, an input terminal having the data width W is connected to an output terminal having the data width W of the register 272, and an output terminal having the data width W is connected to an input terminal having the data width W of the RAM bank 222. The register 276 is a flip-flop, and operates in accordance with the clock signal $f_{CLK}$. In the register 276, an input terminal having the data width W is connected to an input terminal $MB_{IN}$ of the configurable memory block 20, and an output terminal having the data width W is connected to an input terminal having the data width W of the bank 224.

In the double data rate mode, the configurable output module 230 includes a register 231, a register 232, and a multiplexer 235, as shown in FIG. 10. The register 231 operates in accordance with the clock signal $f_{CLK}$, an input terminal having the data width W is connected to an output terminal having the data width W of the RAM bank 222, and an output terminal having the data width W is connected to an input terminal of the multiplexer 235. The register 232 operates in accordance with the clock signal $f_{CLK}$, an input terminal having the data width W is connected to an output terminal having the data width W of the RAM bank 224, and an output terminal having the data width W is connected to an input terminal of the multiplexer 235. An output terminal of the multiplexer 235 is connected to an output terminal $MB_{OUT}$ of the memory block 20.

The configurable memory block 20 having the above described configuration includes not only the memory bank unit 280 but also the configurable input module (an input port) 270 and the configurable output module (an output port) 230. That is, as the configurable memory block 20 includes a write port (an input port) and a read port (an output port), the double data rate mode can be realized.

In the double data rate mode, the configurable input module 270 is reconfigured as a W-up/$f_{CLK}$-down converter, and the configurable output module 230 is reconfigured as a W-down/$f_{CLK}$-up converter, as shown in FIG. 10.

In the normal mode, the configurable input module 270 is reconfigured as an input flip-flop/broadcast wire, and the configurable output module 230 is reconfigured as a bank selector, as shown in FIG. 11.

(Operation in the Double Data Rate Mode)

As shown in FIG. 10, the W-up/$f_{CLK}$-down converter 270 converts a data stream with the data width W and a transfer clock frequency $f_{CLK} \times 2$ into a data stream with the data width 2W and a transfer clock frequency $f_{CLK}$. The write ports of the RAM bank 222 and the RAM bank 224 simultaneously perform write operations in cycles at the frequency $f_{CLK}$. At the same time, the read ports of the RAM bank 222 and the RAM bank 224 simultaneously perform read operations in cycles at the frequency $f_{CLK}$. The W-down/$f_{CLK}$-up converter 230 converts a data stream with the data width 2W and the transfer clock frequency $f_{CLK}$ into a data stream with the data width W and the transfer clock frequency $f_{CLK} \times 2$.

(Operation in the Normal Mode)

As shown in FIG. 11, the input flip-flop/broadcast wire 270 latches a data stream having the data width W at the rate of the frequency $f_{CLK}$, and broadcasts the data stream to input data terminals of the RAM bank 222 and the RAM bank 224. One of the write ports of the RAM bank 222 and the RAM bank 224 is exclusively selected in cycles of the frequency $f_{CLK}$, and only the selected bank performs a write operation. At the same time, one of the read ports of the RAM bank 222 and the RAM bank 224 is exclusively selected in cycles of the frequency $f_{CLK}$, and only the selected bank performs a read operation. Output signals from the RAM bank 222 and the RAM bank 224 are integrated by the bank selector 230, and are outputted as a data stream with the data width W and the transfer clock frequency $f_{CLK}$.

In the double data rate mode, the input and output data transfer rates can be made twice higher than those in the normal mode, without any increase in the number of input terminals $MB_{IN}$ and the number of output terminals $MB_{OUT}$.

As described above, like the first embodiment, the third embodiment can provide a semiconductor integrated circuit that includes configurable memory blocks capable of increasing the data transfer rate without an increase in the number of I/Os.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
   a first memory bank that performs a read operation in accordance with a first clock signal, and outputs first data in accordance with the first clock signal;
   a second memory bank that performs a read operation in accordance with the first clock signal, and outputs second data in accordance with the first clock signal;
   a configurable decoder that is able to make both the first memory bank and the second memory bank simultaneously perform read operations, the configurable decoder supplying address information to the first memory bank and the second memory bank; and
   an output module reconfigurable in one of a first mode and a second mode, the first mode including a function of holding the first data and the second data in accordance with the first clock signal, and alternately outputting the first data and the second data in accordance with a second clock signal having a frequency at least twice higher than the first clock signal, the second mode including at least a function of selecting and outputting the first data or the second data in accordance with the first clock signal.

2. The semiconductor integrated circuit according to claim 1, wherein
   the output module includes:
   a first register group connected to the first memory bank, the first register group holding the first data in accordance with the first clock signal;
   a second register group connected to the second memory bank, the second register group holding the second data in accordance with the first clock signal;
   a first multiplexer that selects and outputs the first data or data held in the first register group;
   a second multiplexer that selects and outputs the second data or data held in the second register group;
   a bank selection address register that holds a bank selection address signal in accordance with the first clock signal;
   a third multiplexer that selects and outputs one of the second clock signal and the bank selection address signal; and
   a bank selection multiplexer that selects and outputs one of an output of the first multiplexer and an output of the second multiplexer in accordance with an output of the third multiplexer.

3. The semiconductor integrated circuit according to claim 1, wherein
   the configurable decoder in the first mode supplies the address information simultaneously to the first memory bank and the second memory bank, and
   the output module in the first mode includes:
   a first register group connected to the first memory bank, the first register group holding the first data in accordance with the first clock signal;
   a second register group connected to the second memory bank, the second register group holding the second data in accordance with the first clock signal; and
   a bank selection multiplexer connected to the first register group and the second register group, the bank selection multiplexer selecting and outputting data held in the first register group or data held in the second register group in accordance with the second clock signal.

4. The semiconductor integrated circuit according to claim 1, wherein
the configurable decoder in the second mode selects one of the first memory bank and the second memory bank in accordance with a bank selection address signal, and exclusively supplies the address information to the selected one of the first memory bank and the second memory bank, and
the output module in the second mode includes:
a bank selection address register that holds the bank selection address signal in accordance with the first clock signal; and
a bank selection multiplexer that selects and outputs the first data from the first memory bank or the second data from the second memory bank in accordance with the bank selection address signal.

5. The semiconductor integrated circuit according to claim 1, further comprising an input module reconfigurable in one of the first mode and the second mode, the input module including an output terminal, a data input terminal of the first memory bank and a data input terminal of the second memory bank being connected to the output terminal,
in the first mode, the input module successively captures first input data and second input data in accordance with the second clock signal, supplies the first input data to the first memory bank in accordance with the first clock signal, and supplies the second input data to the second memory bank in accordance with the first clock signal, and
in the second mode, the input module captures third input data in accordance with the first clock signal, and supplies the third input data simultaneously to the first memory bank and the second memory bank in accordance with the first clock signal.

6. The semiconductor integrated circuit according to claim 1, wherein each of the first memory bank and the second memory bank is a dual port random access memory including a first port and a second port, the dual port random access memory being capable of simultaneously accessing addresses of the first port and the second port.

7. A semiconductor integrated circuit comprising:
a configurable logic block;
a configurable memory block; and
a configurable interconnect block that connects the configurable logic block and the configurable memory block to each other,
wherein the configurable memory block includes:
a first memory bank that performs a read operation in accordance with a first clock signal, and outputs first data in accordance with the first clock signal;
a second memory bank that performs a read operation in accordance with the first clock signal, and outputs second data in accordance with the first clock signal;
a configurable decoder that is able to make both the first memory bank and the second memory bank simultaneously perform read operations, the configurable decoder supplying address information to the first memory bank and the second memory bank; and
an output module reconfigurable in a first mode and a second mode, the first mode including a function of holding the first data and the second data in accordance with the first clock signal, and alternately outputting the first data and the second data in accordance with a second clock signal having a frequency at least twice higher than the first clock signal, the second mode including at least a function of selecting and outputting the first data or the second data in accordance with the first clock signal.

8. The semiconductor integrated circuit according to claim 7, wherein
the output module includes:
a first register group connected to the first memory bank, the first register group holding the first data in accordance with the first clock signal;
a second register group connected to the second memory bank, the second register group holding the second data in accordance with the first clock signal;
a first multiplexer that selects and outputs the first data or data held in the first register group;
a second multiplexer that selects and outputs the second data or data held in the second register group;
a bank selection address register that holds a bank selection address signal in accordance with the first clock signal;
a third multiplexer that selects and outputs one of the second clock signal and the bank selection address signal; and
a bank selection multiplexer that selects and outputs one of an output of the first multiplexer and an output of the second multiplexer in accordance with an output of the third multiplexer.

9. The semiconductor integrated circuit according to claim 7, wherein
the configurable decoder in the first mode supplies the address information simultaneously to the first memory bank and the second memory bank, and
the output module in the first mode includes:
a first register group connected to the first memory bank, the first register group holding the first data in accordance with the first clock signal;
a second register group connected to the second memory bank, the second register group holding the second data in accordance with the first clock signal; and
a bank selection multiplexer connected to the first register group and the second register group, the bank selection multiplexer selecting and outputting data held in the first register group or data held in the second register group in accordance with the second clock signal.

10. The semiconductor integrated circuit according to claim 7, wherein
the configurable decoder in the second mode selects one of the first memory bank and the second memory bank in accordance with a bank selection address signal, and exclusively supplies the address information to the selected one of the first memory bank and the second memory bank, and
the output module in the second mode includes:
a bank selection address register that holds the bank selection address signal in accordance with the first clock signal; and
a bank selection multiplexer that selects and outputs the first data from the first memory bank or the second data from the second memory bank in accordance with the bank selection address signal.

* * * * *